(12) United States Patent
Hoenig et al.

(10) Patent No.: US 6,366,054 B1
(45) Date of Patent: Apr. 2, 2002

(54) METHOD FOR DETERMINING STATE OF CHARGE OF A BATTERY BY MEASURING ITS OPEN CIRCUIT VOLTAGE

(75) Inventors: Steven Hoenig, Staten Island, NY (US); Harmohan Singh, Rockaway; Thirumalai G. Palanisamy, Morristown, both of NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/847,801

(22) Filed: May 2, 2001

(51) Int. Cl.[7] .................................................. H02J 7/00
(52) U.S. Cl. ...................................... 320/132; 324/427
(58) Field of Search ................................. 320/132, 130, 320/107; 324/425, 427, 430, 432

(56) References Cited

U.S. PATENT DOCUMENTS 5,160,880 A * 11/1992 Palanisamy .................. 320/106
5,680,050 A * 10/1997 Kawai et al. ................ 324/427
6,215,312 B1 * 4/2001 Hoening et al. ............. 324/427

* cited by examiner

Primary Examiner—Peter S. Wong
Assistant Examiner—Lawrence Luk
(74) Attorney, Agent, or Firm—Loria B. Yeadon

(57) ABSTRACT

A method for determining the state of charge (SOC) of a battery by measuring its open circuit voltage (OCV) either with the battery in a fully rested state of chemical and electrical equilibrium or an active state during a period in which the battery settles after charge or discharge is stopped. A first type algorithm is developed to correlate the OCV in a fully rested condition ($OCV_{REST}$) to the state of charge at which that measurement is taken. A second type algorithm is developed that predicts a final settling OCV of a battery ($OCV_{PRED}$), based on the set of parameters of OCV, rate of change of OCV, and battery case temperature, acquired during the settling period of a battery not at rest. To determine the SOC of a battery being tested that is in the fully settled state the measured $OCV_{REST}$ is applied to the first type algorithm. To determine the SOC of a battery that has not fully settled, the data of the OCV, rate of change of OCV and battery temperature is applied to a second type algorithm to determine $OCV_{PRED}$ and the $OCV_{PRED}$ value is used in the first type algorithm to determine SOC.

11 Claims, 3 Drawing Sheets

METHOD FOR DETERMINING STATE OF CHARGE OF A BATTERY BY MEASURING ITS OPEN CIRCUIT VOLTAGE

FIELD OF THE INVENTION

The invention relates to a method for determining the state of charge (SOC) of a battery whether in an equilibrium (rest) or active state by measuring on a non-invasive basis the battery open circuit voltage (OCV) and other parameters.

BACKGROUND OF THE INVENTION

It is important to know what percentage of a battery's full energy capacity, measured in amp-hours (Ah), is available at any given time. The capacity percentage is generally called the state of charge (SOC). The SOC directly reflects the capability of a battery and hence the system or application that it powers. Knowing battery SOC is especially important for mission critical applications such as an uninterruptible power source (UPS) application. In such an application, it must be determined when the battery SOC has dropped below an acceptable level so that it can be recharged or replaced.

Several conventional methods exist for determining the state of charge (SOC) of a battery. For a lead-acid battery, one of these methods is the use of electrochemical means of determination. This generally is a method for determining SOC by using the measurements of electrical properties of the battery, such as its open circuit voltage (OCV), which is the voltage measured across the battery terminals with no load on the battery. This is done without making any invasive, physical measurements, e.g., specific gravity of the electrolyte. In addition, this method does not base its value on historic battery performance (i.e. coulomb counting), but on an instantaneous analytic technique.

One method for determining battery SOC based on measuring SOC is described in U.S. Pat. No. 4,754,349, which is owned by the assignee of the subject application. However, in an electrochemical battery, such as of the lead-acid type, polarization of the plates of the battery as well as instantaneous battery condition can affect the functional relationship between SOC and OCV. This may then affect the ability to make an accurate SOC determination by measuring only its OCV. Also, the straightforward determination of SOC based on measured OCV is inaccurate to the degree that the battery is not in a "rested" state. A "rested" state is achieved when the battery has had an opportunity to achieve chemical equilibrium after having undergone a full or partial charge or discharge. When a battery reaches a state of chemical equilibrium, the battery also comes into electrical equilibrium. In some cases, it takes up to several hours for a battery to reach its fully rested state after its charging or discharging is terminated.

A need exists for a method of rapid and accurate electrochemical type determination of SOC of a battery, such as one of the lead acid type, to be extended to points at which the battery is not in an ideal, rested state. This will permit rapid determination of battery SOC under a wider range of its operating conditions, while maintaining measurement accuracy.

BRIEF DESCRIPTION OF THE INVENTION

The present invention relates to a method for determining battery state of charge (SOC) at any time, without having to wait for the battery to settle to a rested state. The invention accomplishes high accuracy SOC measurement, without requiring substantial waiting time before the SOC determination can be made. The invention provides a substantially instantaneous information capability to the SOC determination, and hence provides a mission critical battery system (e.g., UPS system) with a high degree of readiness.

In accordance with the invention, a first type algorithm is developed that relates the battery SOC to the OCV of a battery in its rested state. To do this, a battery is tested by charging and discharging it over a cycle from 0% to 100% and back to 0% and stopping at different values of SOC, e.g., 10%, 20%, 30% . . . 100% during both the charge and discharge portions of the cycle. At each value of SOC the charge or discharge is stopped and the battery is permitted to rest for a time, for example, 2–3 hours, to reach its settled condition. This time is hereafter referred to as the settling period. During the settling period at each SOC value, the battery OCV, rate of change of OCV and battery case temperature are measured until the battery reaches its fully settled state.

The OCV is measured at the end of the settling period for each SOC value. The voltage measured at this time is hereafter referred to as $OCV_{REST}$. A first type algorithm is developed from a plot of the data of the $OCV_{REST}$ versus the various SOC values.

From the monitored OCV, rate of change of OCV and battery case temperature data acquired during the settling period at each of the SOC values, at least one second type algorithm is developed of a predicted rest state OCV, hereafter referred to as $OCV_{PRED}$. The $OCV_{PRED}$ is then used in the first type $OCV_{REST}$ vs. SOC algorithm to determine the battery SOC as if the battery was in the rested state. In a preferred embodiment of the invention, two second type $OCV_{PRED}$ value algorithms are developed for different ranges of battery SOC.

In accordance with the invention, to determine the SOC of a battery under test, it is only necessary to measure its OCV. If the battery is in the settled, or rest state, then the OCV can be used directly with the first type algorithm to determine its SOC. If the battery being tested is still in the active (not settled) state, then the measured actual SOC, rate of change of SOC and battery case temperature is used in a second type algorithm to determine an $OCV_{PRED}$ voltage that is then used with the first type algorithm to determine the battery SOC as if it is in the settled state.

OBJECTS OF THE INVENTION

It is therefore an object of the invention to provide a method to determine the available energy capacity percentage (SOC) of a battery by measuring its OCV.

Another object is to provide a method to determine battery SOC by measuring its OCV without having to wait for the battery to reach a rested state.

Yet a further object is to provide a method to determine battery SOC on an instantaneous basis by measuring its OCV and without having to use invasive measurements.

An additional object is to determine the SOC of a battery by measuring its OCV and using the measured OCV value with algorithms that relate SOC to OCV for any condition of the battery.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
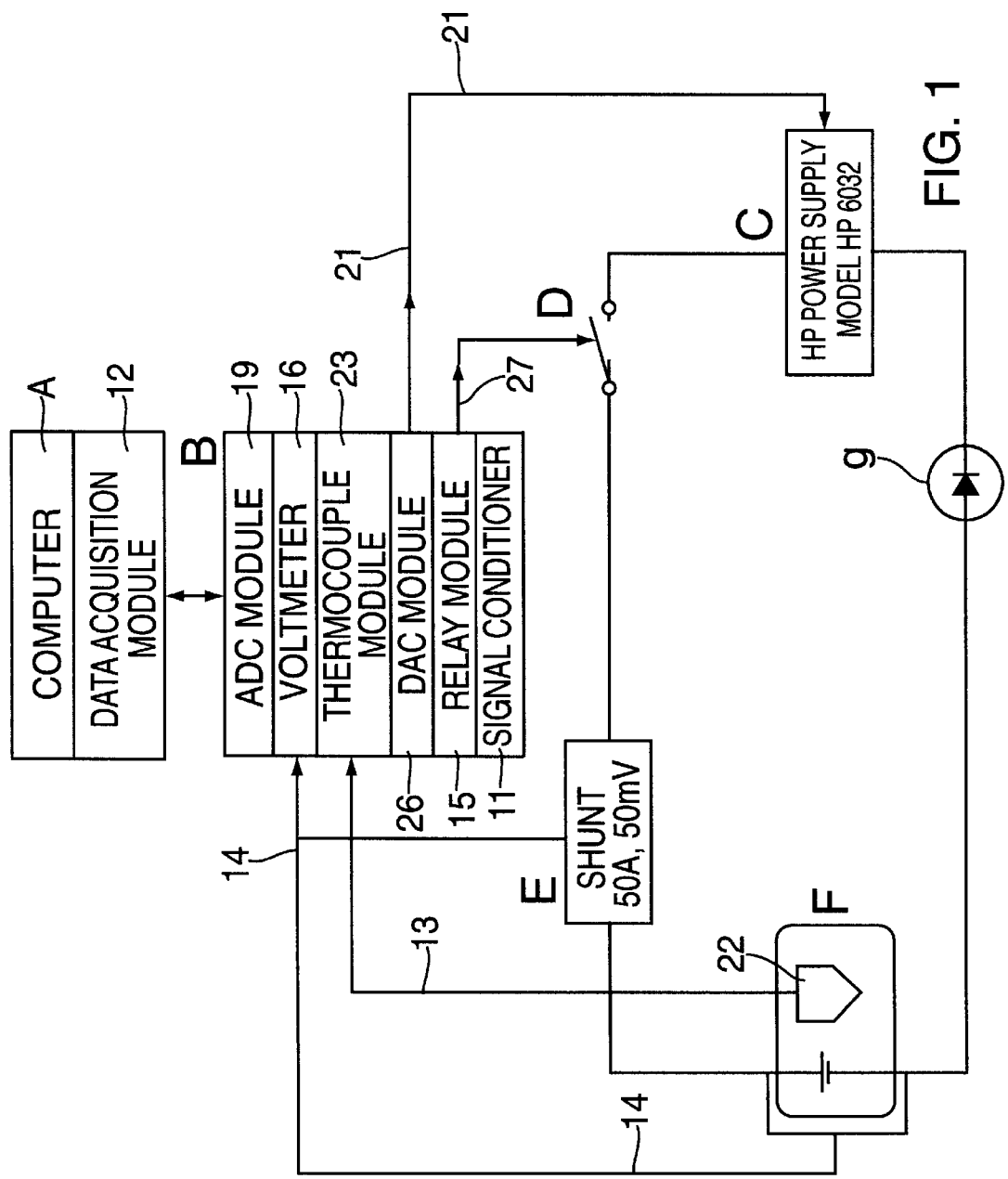
FIG. 1 is a schematic diagram of a circuit for carrying out the invention.

In the performance of the invention, a battery charging and monitoring system is used. The system can be a stand alone unit or one of separate components. Each version of the system includes a power supply, computer, data acquisition system and/or a voltmeter. There are many configurations that can effectively form the system and a typical configuration is shown in FIG. 1. While the method is illustratively described with reference to a lead-acid storage battery, it has applications to other types of batteries, such as NiCd, AgZn, NiMH and Li-Ion.

In FIG. 1 there is a computer A of any suitable conventional microprocessor or microcontroller type that includes a data input device, e.g., a keyboard (not shown), and output device, e.g., a printer and/or display (not shown). The computer A includes an application program having the necessary instructions to control the charging and discharging of the battery and to perform various measurement, calculation and diagnostic functions, as described below. The application program can be embedded in a read only memory (ROM) or in a suitable device such as a PROM that can be reprogrammed. The computer A also includes the usual RAM type memory, data processing unit and computational facilities. It also has its own internal clock that interfaces with the application program. The computer is also shown as having a data acquisition module (DAQ) 12 that inputs the data from various sources as described below.

Charging current is supplied to a battery F being tested from a programmable variable current (power supply) source C whose output is controllable, as explained below, by analog voltage signals over line 21 from a digital to analog converter (DAC) 26 associated with computer A. That is, the computer application program produces the signals to control the current source. The current source C can be any conventional type that is controllable by computer A to have a variable output to charge the battery. The computer also controls a variable load to discharge the battery. For example, for source C, a Hewlett Packard Model HP 6032A can be used.

The current path from source C to one of the battery F terminals, here shown as the positive one, is through a relay D that also is under control of the computer A. The battery current supply circuit also includes a protective diode G in series between the common output of current source C and the negative terminal of the battery to protect the source C from any reverse current from the battery.

Reference character B indicates a unit having a data input portion, that can include a signal conditioner 11, for example, a National Instruments Signal Conditioning System. There is also a control portion that is connected to the computer A for bidirectional communication. Unit B also includes a voltmeter 16 whose input leads 14 are connected across the battery positive and negative terminals to measure its voltage during charging, discharging, and open circuit (no charge or discharge) conditions. Unit B also includes a thermocouple module 23 that receives temperature data over line 13 from a thermocouple 22 that is placed at any suitable location, such as on the case of the battery F.

Current in the battery charge/discharge circuit is measured under control of Unit B by measuring the voltage across a shunt E. Any other suitable technique can be used to measure the current, for example, a Hall effect device. The measured voltage, current and temperature, each an analog quantity, are converted to digital form by an analog-digital converter (ADC) module 19 in unit B and the digital data of these parameters is supplied to computer A.

Unit B also includes the digital to analog converter (DAC) 26 to produce analog control signals from the digital signals supplied by the computer A as directed by its application program. The digital-to-analog converter 26 in the control portion of unit B responds to digital output signals from computer A to produce the analog signal on line 21 to control the current source C.

Unit B includes a relay control module 15 to provide to the relay D over line 27 the signals originating from the computer A to control opening and closure of the contact of relay D. During charging/discharging of battery F, the relay D is closed. When relay D is open, battery F is taken out of the circuit, that is, no charge can be applied. At this time, the battery open circuit voltage (OCV) can be measured.

The method and system for performing the diagnostic of the battery are under control of the application program of computer A to automatically perform the entire diagnostic testing of a battery F through the use of the computer A and the data acquisition and output control portions of unit B. The computer controls the entire charging-discharging and diagnostic testing of the battery. The operation of the system and the method of analysis are described below.

In performing the method, a consistent basis is maintained for battery SOC. That is, the battery is charged and discharged at constant current levels under control of the computer A and its application program to specific values of SOC. The charging system is opened to arrive at accurate SOC levels for subsequent measurements and ultimate algorithm development.

The first stage of the invention is the development of a universal $OCV_{REST}$ vs SOC algorithm. This algorithm gives battery SOC at any SOC value reached by battery charge or discharge as a function of the measured OCV of a fully rested, non-defective battery at the SOC value. This involves measuring the OCV of a battery at a given SOC value during the settling period, that is, from the time that the charge or discharge is removed from the battery until it has reached its fully settled state, as indicated by no further change in OCV. When the battery has fully settled, the OCV value is measured, the settled state OCV value hereafter called $OCV_{REST}$.

The second stage is to develop a voltage predictive algorithm model that, based on measurement of battery OCV, change in voltage, and temperature at any time before it has reached a fully settled state, predicts the battery OCV voltage that will be reached at the fully settled condition. As noted above, this OCV value is hereafter called $OCV_{PRED}$. This step provides the ability to identify the "true" SOC of a battery based on a measurement of its OCV in a condition other than a fully settled state, and not one that is strongly influenced either by polarization or by battery state. As described below, in testing a battery to determine its true SOC, the $OCV_{PRED}$ value is applied to the $OCV_{REST}$ value vs. SOC algorithm developed in the first stage. The development of Stages 1 and 2 algorithms occur within the same test procedure, as is described below.

The invention is described with respect to a lead acid storage battery having a number of cells sufficient to produce a rated voltage of 24V. The method is applicable to other types of storage batteries, as indicated above, and of other rated voltages and of various capacities.

Stage 1—Development of $OCV_{REST}$ vs SOC Algorithm

A battery of known performance capacity and of acceptable state of health, that is, has no known defects and is operating according to specification, is attached to the battery charger/analyzer system of FIG. 1. The thermocouple is attached to the battery case. The battery should be at a fully discharged state (based on the proper performance ranges). At this point the battery is ready to be cycled through the algorithm development process. The purpose of this is to process the battery through a complete charge and discharge cycle, i.e., from 0% to 100% SOC and back to 0% SOC, stopping at specific values of SOC to acquire certain data during the settling period of the battery to its fully rested state. These states of charge values are predetermined and are arrived at by applying to (or removing from) the battery specific amounts of energy so as to reach the desired specific SOC level.

In a preferred embodiment, the battery is cycled up (charged) and down (discharged) stopping at 10% SOC intervals, for example at values of 10%, 20% . . . 100% SOC. This is accomplished by operating the current supply source C under control of computer A to apply to the battery a charge equal in magnitude to its rated capacity (Ah)/10, with voltage constraints to prevent gassing. A similar procedure is used for removing energy from the battery after it has been fully charged (100% SOC) stopping at 10% SOC levels. The discharge can be measured by Coulomb counting. Coulomb counting is achieved by measuring average current into or out of the battery during a loop cycle, multiplied by the cycle period. The coulomb count of the current drawn, in Ah, is subtracted from the previous value of the available energy (SOC) giving a recomputed remaining SOC.

For the entire cycle of charge and discharge, battery voltage and case temperature are monitored under control of computer A. At each level of SOC, the charge or discharge is stopped and the battery is permitted to settle to reach equilibrium. At given times during the time that the battery is settling, a set of three parameters are recorded as data points. These are (1) battery voltage (OCV), (2) rate of change of battery OCV voltage, and (3) case temperature. Battery OCV and case temperature are taken as instantaneous measurements, while rate of change of OCV is measured over a predetermined time period, for example, 30 seconds. All of this data is stored in the computer memory for later use to develop algorithms, as described below. The more frequently that the data points are taken, the more precise the eventual calculation will be.

Battery efficiency effectively measures the amount of energy that can be drawn from a battery versus the amount that can be put in. This is taken into account in aligning the SOC values achieved in both the charge and discharge portions of cycling the battery.

Once the battery reaches a desired SOC value, e.g., 40%, 50% . . . 100%, at the end of a specified quantity of charge or discharge, the battery is allowed to rest for a substantial amount of time. This amount of time is intended to be at least equal to the amount of time it takes for a battery to settle to its "rested" state, as indicated by the constancy of OCV over a substantial period of time. In the example being described, 3 hours is used, but this time can vary for different types, constructions, and sizes of batteries. The OCV of the battery is monitored and recorded during the settling time.

Figure 2:
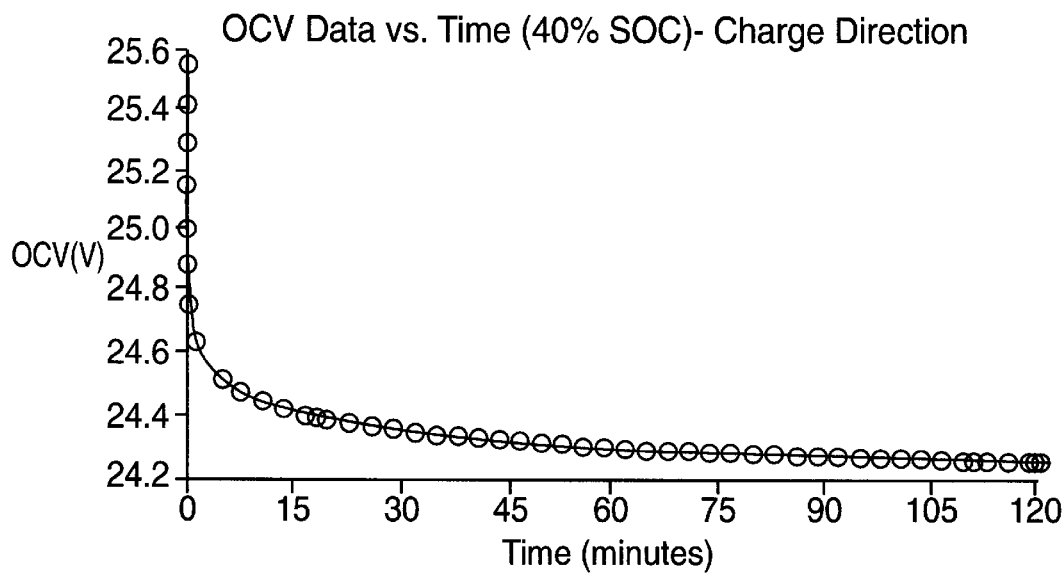
FIGS. 2 and 3 show OCV data points during the settling period for a battery having a 40% SOC in the charge and discharge directions.
Figure 3:
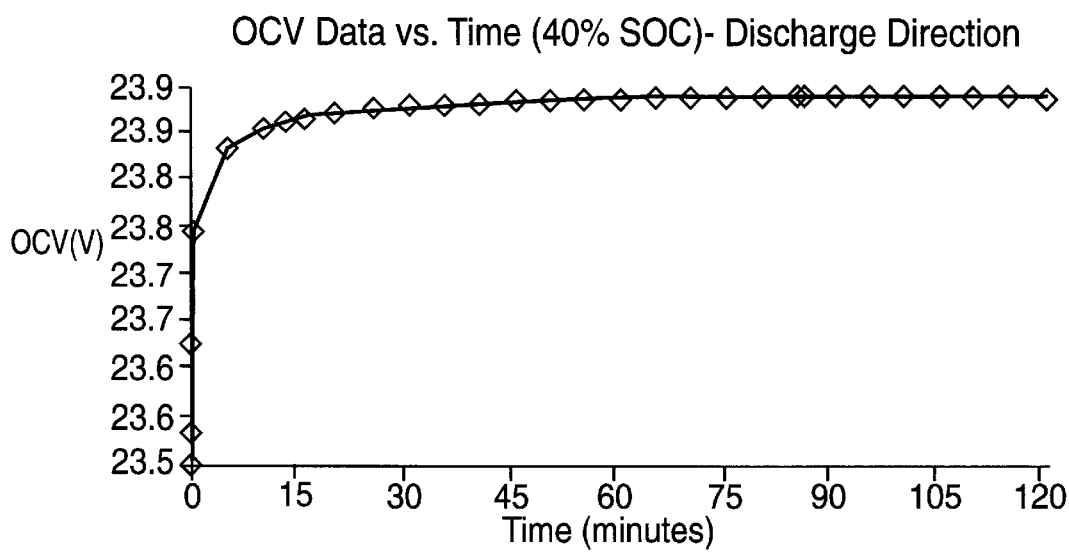

FIGS. 2 and 3 show the settling period curves (OCV vs Time) for battery voltage in the charge and discharge portions of the cycle, respectively. The OCV data is shown measured at various time intervals during the settling period, such as for example, 5 minutes, 10 minutes, 30 minutes, 60 minutes, and 120 minutes. Other intervals of fewer or greater number can be used. For the example being described, FIGS. 2 and 3 respectively show the OCV during the settling periods after charge and discharge at numerous various times for a battery charged and/or discharged to a condition of 40% SOC. That is, the battery has reached a value of 40% SOC, the charge (FIG. 2) or discharge (FIG. 3) is stopped and then the battery is permitted to rest (no charge or discharge) for 2 hours, as shown. During the settling period, relay G is opened and the OCV is measured and data points acquired.

After the required settling time has elapsed, 120 minutes being shown, the final OCV data point, $OCV_{REST}$, is acquired. The battery is cycled to the next higher (charge) or lower (discharge) SOC value. At each SOC value the battery is permitted to rest to its settled state. The OCV, rate of change of OCV and temperature data is acquired for each SOC value on both the charge and discharge portions of the cycle. The value of $OCV_{REST}$ is also acquired for each OCV value. A set of curves similar to FIGS. 2 and 3 can be developed for each of the SOC value steps. The higher the battery SOC value, the higher will be the $OCV_{REST}$ in the fully settled state.

Figure 4:
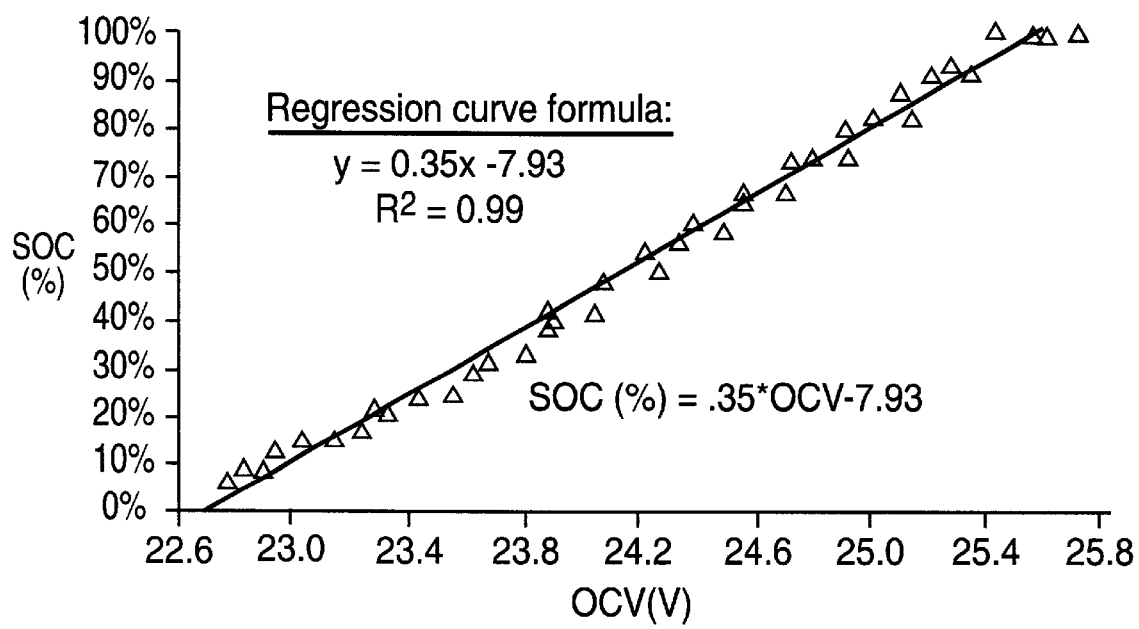
FIG. 4 is a graph of the SOC vs $OCV_{REST}$ data points.

Having the data points of $OCV_{REST}$ at the various SOC level values, the first calculation aspect of the invention is applied. The set of battery $OCV_{REST}$ data points (last OCV data point after 2 hours, as in FIGS. 2 and 3) are plotted against the SOC levels of both the charge and discharge portions of the battery cycling. FIG. 4 shows the various data points of battery $OCV_{REST}$ at different SOCs from 0% to 100%. It is seen from FIG. 4 that battery $OCV_{REST}$ is generally a linear function of the battery SOC value.

Through conventional curve fitting techniques, a 1st order algorithm is computed that calculates SOC as a function of $OCV_{REST}$. This is shown in FIG. 4 as:

$$y=ax-b, \text{ where } a \text{ and } b \text{ are numerical values} \tag{1}$$

For the data from the specific battery being analyzed:

$$SOC(\%)=0.35\ OCV_{REST}-7.93 \tag{2}$$

It should be noted that the numerical weighting values for $OCV_{REST}$ and the constant will be different for different types, constructions, and sizes of batteries but the overall concept still applies.

Accordingly, by using equation (2), it is possible to determine the SOC of a battery of the type to which the algorithm applies that has reached its equilibrium state after charge or discharge simply by measuring its $OCV_{REST}$. That is, the OCV of a battery is measured after the battery has fully settled and, using the data curve of FIG. 4, it is only necessary to vertically extend the measured $OCV_{REST}$ value point until it meets the curve and then horizontally extending a line to meet the SOC vertical axis. The intersection of the horizontal line and the vertical axis is the SOC of a fully rested battery. Alternatively, the SOC can be numerically calculated using equation (2) above.

The technique described above for determining SOC of a battery having reached an equilibrium, state using equation (2), achieves a relatively high degree of accuracy. In the example being described, there is a confidence factor of $R^2=0.99$. However, as is the case with other data monitoring techniques, adding data points from several charge and discharge cycles, as well as from other batteries of the same description (capacity), will enhance the accuracy and reliability of the determination curve/algorithm of equation (1). This curve can also be adjusted to different cycle ranges of OCV of the same battery. The degree of adjustment will depend on how tightened the cycle ranges will be. However, the chosen cycle range of 0% to 100% SOC conforms for the most part with standard lead-acid cycling practice. Broadening of the cycle range with respect to voltage limits will therefore achieve very minimal, if any gains in capacity and efficiency. It will therefore affect the developed algorithm very minimally, if at all. Different battery types (construction, materials, automotive, industrial. etc) may function over slightly different cycling ranges and conditions. While using the developed algorithm (eq. 2) would result in loss of accuracy, much like the conditions described above, these errors would not be substantial. However, to maintain the peak possible accuracy of measurement, the algorithm could be redeveloped using a new sample set for data accumulation.

The type of algorithm, equation (1), can be used to analyze a battery that has reached equilibrium after a charge or discharge. However, if the OCV of a battery is measured while the battery is active (non-equilibrium state), after it has been either charged or discharged recently, or has developed a polarized state, equation (1) loses its reliability. To deal with this problem, the next aspect of this invention applies. Here, the OCV of an active battery being analyzed is measured and used in another algorithm to obtain an OCV value (called "$OCV_{PRED}$") predicted as if the battery is in a rested state. Once $OCV_{PRED}$ is determined within a reasonable degree of certainty, this can be used to determine SOC based on equation (1).

The value of $OCV_{PRED}$ of a battery being tested is determined as a function of its current OCV, the rate at which that OCV is changing, and the temperature of the battery during the settling period as compared with the temperature conditions of the test location. These measured and calculated parameters are used in a second type algorithm to determine predicted OCV for the battery under test. In the case of this invention, all data was taken at room temperature.

Stage 2—Development of $OCV_{PRED}$ Algorithms

It has been found that the $OCV_{PRED}$ determination can be made fairly accurately as a linear function of the above three variable parameters (OCV, rate of change of OCV, and battery temperature) acquired during the settling period after termination of charge or discharge. The linear function (algorithm) is produced from the data sets of the three parameters acquired in Stage 1 during the settling period at each of the SOC values. These data sets are subjected to a linear estimation technique, for example, the one found in the Microsoft EXCEL program, to develop an algorithm of $OCV_{PRED}$ based on these three data values. The algorithm produced gives a weighting to each of the parameters OCV, rate of change of OCV (called dV/dt) and battery case temperature. The general form of the algorithm is:

$$OCV_{PRED}=a*OCV_c+b*dV/dt-c*Temp-d \quad (3)$$

where, $OCV_c$ is the OCV measured in the battery active state, and a, b, c and d are numerical values.

It has been discovered that over different SOC ranges the weightings a, b and c of the three determination variable parameters and the offset d are different. The difference in relationship between the variables and $OCV_{PRED}$ can be split into several regions, there being two such regions in the example being described. Thus, there would be two algorithms like (3) but with different weighting values. The SOC value that separates the two regions is a function of battery type, size and construction. In the example being described, the first region is comprised basically of lower SOC portions of the battery cycle, which ranges up to about 75% SOC. The second region is above 75% SOC.

The weightings for the parameters and offset in the lower SOC range for the illustrative battery being tested are shown in Table 1.

TABLE 1

$OCV_{PRED}$ DETERMINATION WEIGHTINGS - BELOW 75% SOC

| PARAMETER | WEIGHT |
|---|---|
| OCV | 1.165 |
| dV/dt | 6.95 |
| Temperature | −0.167 |
| Offset | −0.95 |

The second region covers SOC above 75%. The weightings for this region are shown in Table 2.

TABLE 2

$OCV_{PRED}$ DETERMINATION WEIGHTINGS - ABOVE 75% SOC

| PARAMETER | WEIGHT |
|---|---|
| OCV | 1.027 |
| dV/dt | 9.288 |
| Temperature | −0.197 |
| Offset | −0.56 |

The reason for the divergence in battery performance can be attributed to the presence of gassing within the charge discharge cycle at the higher states of charge, i.e., above 75% SOC. Therefore, to be most accurate, at any point where the battery can undergo the gassing reaction (based on the current and voltage used to charge the battery up to that state), the second battery qualification must be used. Therefore two different algorithms have been developed to determine the final $OCV_{PRED}$. For the illustrative lead-acid battery, these are:

Below (2.08V)*(# of cells)

$$OCV_{PRED}=OCV_c*1.165+6.95*dV/dt-0.167*Temp-0.95 \quad (4)$$

Above (2.08V)*(# of cells)

$$OCV_{PRED}=OCV_c*1.027+9.288*dV/dt-0.0197*Temp-0.56 \quad (5)$$

where:

$OCV_{PRED}$ is the predicted OCV, $OCV_c$ is the value of the current OCV measured, dV/dt is the rate of change of the OCV and T is the battery case temperature.

The qualifying point to choose between the two algorithms (4) and (5) can be made based on a rough OCV prediction or measurement. In the regions surrounding 75% SOC the inaccuracy introduced through the use of the wrong algorithm would be minimal. The point of distinction therefore is not in need of high precision. In the example described of a lead-acid battery rated at 24V, the value 25V is used as the decision point. This value can be translated to 2.08V multiplied by the number of cells.

It is again noted that the numeral weightings will change for different types and sizes of battery.

Based on the above algorithms, the basic procedure for SOC determination of an active battery, i.e., one not having reached its rested state, includes the following steps, which are carried out under control of computer A. The first step is to measure battery OCV for a period of 30 seconds, along with the case temperature by the thermocouple at some point within the 30 second measurement period. The initial OCV measured at the beginning of the period is subtracted from the final voltage measured, and that value is divided by the 30 second time period to determine dV/dt. Depending on the accuracy of the tester's measurement hardware, a larger or smaller time period could be used. The acquired data is applied to the second type algorithm of equation (3). If SOC range is a consideration for accuracy, then there would be a selection from one or two, or perhaps even more, of type (3) algorithms, such as those of equations (4) or (5).

The OCV, dV/dt, and temperature values are weighted as per the selected type (3) equation algorithm used and the $OCV_{PRED}$ value is computed. That value is then used in the $OCV_{REST}$ vs. SOC algorithm (see FIG. 4), and a resulting rested SOC value is determined. This rested SOC value based on $OCV_{PRED}$ has been shown to be within 5% accuracy, based on testing performed using the principles of the invention.

The invention allows the user to determine the SOC of a battery as if it were in the rested condition without having to discharge and then fully cycle the battery to compare Ah out (the amount of the capacity used) to the total available capacity. It also allows the user to determine the true SOC, as if the battery had been in a rested state, without having to make any physical and/or invasive measurements. Finally, it allows the user to determine SOC at any point in time, independent of the battery state, both physically and with respect to time, without having to wait to reach equilibrium.

The invention was successfully developed and tested for commercial lead-acid batteries over the range 10 Ah to 20 Ah. Batteries tested were 24V nominal voltage batteries, but the principle can be translated to a per cell basis, thereby allowing this invention to be used over any range of nominal battery voltage. Therefore all limits for cycling and all measurements and decision points can be translated to a single cell level and, after that, re-translated to any number of cells and therefore any voltage range. A single lead-acid cell has a nominal voltage of 2V, and all limits and values developed for the 24V batteries can be translated to a single cell by dividing by 12.

Specific features of the invention are shown in one or more of the drawings for convenience only, as each feature may be combined with other features in accordance with the invention. Alternative embodiments will be recognized by those skilled in the art and are intended to be included within the scope of the claims.

We claim:

1. A method to determine the state of charge (SOC) of a battery comprising the steps of:
   at least one of charging or discharging the battery to reach different levels of SOC;
   measuring the battery open circuit voltage (OCV) at each of the different levels of SOC at a time after the charging or discharging has stopped and the battery has reached an equilibrium settled state; and
   developing a first type algorithm of battery OCV in the settled state ($OCV_{REST}$) for different values of SOC.

2. The method of claim 1 further comprising the steps of:
   measuring the $OCV_{REST}$ of a battery being tested; and
   applying the first type algorithm to the measured $OCV_{REST}$ of the battery being tested to said first type algorithm to determine the battery SOC.

3. The method of claim 1 wherein said first type algorithm is $$SOC = a*OCV_{REST} - b$$

where a and b are numeral values.

4. The method of claim 3 wherein for a lead-acid battery said first type algorithm is $$SOC = 0.35*OCV_{REST} - 7.93.$$

5. The method of claim 1 further comprising the step of acquiring data parameters of battery OCV, rate of change of OCV and battery temperature at various times during a settling period from when charge or discharge of the battery is stopped at a given level SOC and until it reaches its settled state; and
   developing from the acquired data at least one second type algorithm that computes a predicted OCV value ($OCV_{PRED}$) related to the data parameters acquired during said settling period.

6. The method of claim 5 wherein said at least one second type algorithm is of the form $$OCV_{PRED} = a*OCV_c + b*dV/dt + c*Temp - d$$

where a, b, c and d are numeral values,
   $OCV_{PRED}$ is the predicted OCV,
   $OCV_C$ is the value of the current OCV measured,
   dV/dt is the rate of change of the OCV, and
   T is the battery case temperature.

7. The method of claim 6 wherein two second type algorithms are developed each having different values for the terms a, b, c and d for each of respective different ranges of battery SOC.

8. The method of claim 7 wherein for a lead-acid storage battery the weighting of the terms are:
   Below (2.08V)*(# of cells)

$$OCV_{PRED} = 1.165*OCV_c + 6.95*dV/dt - 0.167*Temp - 0.95;$$

and
   Above (2.08V)*(# of cells)

$$OCV_{PRED} = 1.027*OCV_c + 9.288*dV/dt - 0.0197*Temp - 0.56.$$

9. The method of claim 5 further comprising the steps of:
   measuring the current OCV, rate of change of OCV and temperature of a battery being tested at any time during a settling period;
   applying the measuring data of the battery being tested to a second type algorithm to determine the $OCV_{PRED}$; and
   applying the first type algorithm equation to the $OCV_{PRED}$ value to obtain a battery SOC value corresponding to the battery being tested being in the rested state.

10. The method of claim 7 further comprising the steps of:
   measuring the current OCV, rate of change of OCV and temperature of a battery being tested at any time during the settling period;
   applying the measured data of the battery being tested to one of said second type algorithms selected based on the battery SOC range to determine the $OCV_{PRED}$; and
   applying the first type algorithm equation to the $OCV_{PRED}$ value to obtain a battery SOC value corresponding to the battery being tested being in the rested state.

11. The method of claim 10 wherein for a multi-cell lead-acid battery the second type algorithms are:
   Below (2.08V)*(# of cells)

$$OCV_{PRED} = 1.165*OCV_c + 6.95*dV/dt - 0.167*Temp - 0.95;$$

and
   Above (2.08V)*(# of cells)

$$OCV_{PRED} = 1.027*OCV_c + 9.288*dV/dt - 0.0197*Temp - 0.56.$$

* * * * *